United States Patent
Michael

(10) Patent No.: US 8,737,135 B2
(45) Date of Patent: May 27, 2014

(54) METHOD FOR AND FLASH MEMORY DEVICE HAVING IMPROVED READ PERFORMANCE

(75) Inventor: Oron Michael, San Jose, CA (US)

(73) Assignee: Winbond Electronics Corporation, Taichung (TW)

( * ) Notice: Subject to any disclaimer, the term of this patent is extended or adjusted under 35 U.S.C. 154(b) by 191 days.

(21) Appl. No.: 13/216,103

(22) Filed: Aug. 23, 2011

(65) Prior Publication Data

US 2013/0051154 A1    Feb. 28, 2013

(51) Int. Cl.
G11C 11/34 (2006.01)
G11C 16/06 (2006.01)

(52) U.S. Cl.
USPC ............. 365/185.21; 365/185.18; 365/185.01

(58) Field of Classification Search
USPC ............... 365/185.21, 185.18, 185.2, 185.33, 365/185.25, 226, 185.01, 189.05, 189.07, 365/189.09, 205, 207, 208, 210
See application file for complete search history.

(56) References Cited

U.S. PATENT DOCUMENTS

| 7,558,900 | B2 | 7/2009 | Jigour et al. | |
|---|---|---|---|---|
| 2009/0268543 | A1* | 10/2009 | Chen et al. | 365/230.02 |
| 2012/0105124 | A1* | 5/2012 | Park et al. | 327/283 |
| 2012/0127812 | A1* | 5/2012 | Nishioka et al. | 365/194 |

OTHER PUBLICATIONS

Winbond Electronics Corporation, spiflash Serial Flash Memories, Rev 1.4, Mar. 2011, 2 pages.
Winbond Electronics Corporation, W25Q32DW spiflash 1.8V 32M-Bit Serial Flash Memory with Dual/Quad SPI and QPI, Preliminary Revision C, Jan. 18, 2011, 82 pages.
Winbond Electronics Corporation, W25Q64DW spiflash 1.8V 64M-Bit Serial Flash Memory with Dual/Quad SPI and QPI, Preliminary Revision C, Jan. 13, 2011, 82 pages.

* cited by examiner

*Primary Examiner* — Son Dinh
*Assistant Examiner* — Uyen B Tran
(74) *Attorney, Agent, or Firm* — David H. Carroll

(57) ABSTRACT

A Flash memory device operable under a single-bit or multiple-bit serial protocol is provided with a capability to determine the address boundary condition of an application from the address field of an address boundary configurable ("ABC") read command. Based on the identified address boundary condition, the Flash memory device may perform multiple sensing of the memory array as required by the ABC read command using optimal internal sense times for each sensing. The number of dummy bytes may be specified for the read command in advance by the user, based on the address boundary of the application and the desired frequency of operation of the Flash memory device. Therefore, Flash memory device read performance is improved both by minimizing the number of dummy bytes in the read command and by optimizing the internal sense times for the read operation.

16 Claims, 6 Drawing Sheets

| DUMMY/A<1:0> | SENSE SEQUENCE | 00 (A0=0, A1=0) D-WORD BOUNDARY | 10 (A0=0) WORD BOUNDARY | 11 (NO A RESTRICTION) BYTE BOUNDARY |
|---|---|---|---|---|
| 2 DUMMY CLOCK | FIRST SENSE | 1.5 X TCC (42 MHZ)** SPEC 30 MHZ | 1.5 X TCC (42 MHZ)** SPEC 30 MHZ | 1.5 X TCC (42 MHZ)** SPEC 30 MHZ |
| | SUBSEQUENT SENSE | 4.5 X TCC (128 MHZ) | 2.5 X TCC (71 MHZ) | 1.5 X TCC (42 MHZ)** |
| 4 DUMMY CLOCK | FIRST SENSE | 4.0 X TCC (114 MHZ)** SPEC 80 MHZ | 3.5 X TCC (100 MHZ)** SPEC 80 MHZ | 2.5 X TCC (71 MHZ)** SPEC 50 MHZ |
| | SUBSEQUENT SENSE | 5.5 X TCC (157 MHZ) | 3.5 X TCC (100 MHZ) | 2.5 X TCC (71 MHZ)** |
| 6 DUMMY CLOCK | FIRST SENSE | 4.5 X TCC (128 MHZ)** SPEC 104 MHZ | 4.5 X TCC (128 MHZ)** SPEC 104 MHZ | 3.5 X TCC (100 MHZ)** SPEC 80 MHZ |
| | SUBSEQUENT SENSE | 6.0 X TCC (171 MHZ) | 4.5 X TCC (128 MHZ) | 3.5 X TCC (100 MHZ)** |
| 8 DUMMY CLOCK | FIRST SENSE | 6.5 X TCC (185 MHZ)** SPEC 166 MHZ | 4.5 X TCC (128 MHZ)** SPEC 104 MHZ | 4.5 X TCC (128 MHZ)** SPEC 104 MHZ |
| | SUBSEQUENT SENSE | 6.5 X TCC (185 MHZ)** | 5.5 X TCC (157 MHZ) | 4.5 X TCC (128 MHZ)** |

FIG. 7

METHOD FOR AND FLASH MEMORY DEVICE HAVING IMPROVED READ PERFORMANCE

BACKGROUND OF THE INVENTION

1. Field of the Invention

The present invention relates to flash memory, and more particularly to the reading of flash memory.

2. Description of Related Art

Single-bit serial and multiple-bit serial Flash memory has become popular due to low pin count and simplicity of the interface. The simplest interface is the one-bit Serial Peripheral Interface ("SPI"). The one-bit SPI protocol involves sending a 8-bit command, address bytes, and optional dummy bytes by a user to the SPI Flash memory device, and in response the SPI Flash memory device returns data to the user. A unique 8-bit command may identify a read, an erase/program, or another appropriate operation. Multiple-bit serial interfaces such as SPI-Dual, SPI-Quad, and the Quad Peripheral Interface ("QPI") have been developed for high performance system applications which require fast read performance. In the SPI-Quad interface, an 8-bit command is provided serially one bit at a time, but all subsequent fields (e.g. address, optional dummy bytes, and data) are done on a 4-bit (Quad) serial basis to improve read thru-put. In the QPI interface, all of the fields (e.g. 8-bit command, address, optional dummy bytes, and data) are done in 4-bit serial. As such, the QPI interface provides an 8-bit command in two clock cycles, whereas the SPI-Quad needs eight clock cycles. By reducing the number of clock cycles needed to provide the read command, the QPI interface achieves better read performance compared to both SPI and SPI-Quad interface. Various multiple-bit serial Flash interface protocols are described in, for example, U.S. Pat. No. 7,558,900 issued Jul. 7, 2009 to Jigour et al.

In an attempt to minimize latency, different read commands are used for different address boundaries, and these different commands use different numbers of dummy bytes (which may include mode bytes) depending on the address boundaries; see FIG. 1 and FIG. 2. In the SPI Quad interface, for example, an 8-bit command is provided to the Flash memory device in accordance with the 1-bit serial interface (e.g. by I/O0), but subsequent interfacing is done in accordance with the 4-bit Quad interface (e.g. by I/O0-I/O3 (not shown)). The command and address are provided to the SPI Flash memory device and latched on the "rising edge" of clock, and Data-out is provided by the SPI Flash device on the "falling edge" of clock.

FIG. 1 shows a type of SPI-Quad command known as EBh_SPI (or Fast read Quad I/O) which does not impose an address restriction since it assumes a byte boundary. This command includes 6 dummy clocks. FIG. 2 shows a type of SPI-Quad command known as E7h_SPI (or Word read Quad I/O) which restricts the address to a word boundary (A0=0). Because of the address boundary restriction explicit in the command, this need include only 4 dummy bytes. Therefore, the E7h_SPI command provides higher system read performance as measured by reduced latency compared to the EBh-_SPI command.

Various modes of operation, including SPI, SPI-Quad, and a full Enhanced SPI mode which supports multiple-bit serial input and output, are described in U.S. Pat. No. 7,558,900, issued Jul. 7, 2009 to Jigour et al.

Nonetheless, even higher system read performance is desirable for certain applications.

BRIEF SUMMARY OF THE INVENTION

One illustrative embodiment of the invention is a method of operating a memory device having a Flash memory cell array to provide data to an application in response to a read command, wherein the application has an address boundary. The method comprises receiving a read command which includes a start address; configuring the memory device for the address boundary of the application; performing a sequence of sense operations on the Flash memory cell array in response to the read command. The sequence of sense operations comprises a first sensing of the Flash memory cell array to acquire first data for output, the first sensing having a first position in the sequence and occurring over a first internal sense time; furnishing the first data as an output of the memory device; a second sensing of the Flash memory cell array to acquire second data for output, the second sensing having a second position in the sequence and occurring over a second internal sense time; and furnishing the second data as an output of the memory device. The first internal sense time and the second internal sense time are variable for improved read performance depending on the address boundary of the application and the time budgets for the first and second sensings.

Another illustrative embodiment of the present invention is a method of operating a memory device having a Flash memory cell array to provide data to an application in response to a read command, wherein the application has a first address boundary at first times and a second address boundary at second times different than the first times. The method comprises receiving a first read command which includes a first start address; configuring the memory device for the first address boundary of the application; performing a first sequence of sense operations on the Flash memory cell array in response to the first read command, receiving a second read command which includes a second start address; configuring the memory device for the second address boundary of the application; and performing a second sequence of sense operations on the Flash memory cell array in response to the second read command. The first sequence comprises a first sensing of the Flash memory cell array to acquire first data for output, the first sensing having a first position in the first sequence and occurring over a first internal sense time; furnishing the first data as an output of the memory device; a second sensing of the Flash memory cell array to acquire second data for output, the second sensing having a second position in the first sequence and occurring over a second internal sense time; and furnishing the second data as an output of the memory device; wherein the first internal sense time and the second internal sense time are dependent on the first address boundary of the application and the time budgets for the first and second sensings. The second sequence comprises a third sensing of the Flash memory cell array to acquire third data for output, the third sensing having a first position in the second sequence and occurring over a third internal sense time; furnishing the third data as an output of the memory device; a fourth sensing of the Flash memory cell array to acquire fourth data for output, the fourth sensing having a second position in the second sequence and occurring over a fourth internal sense time; and furnishing the fourth data as an output of the memory device; wherein the third internal sense time and the fourth internal sense time are dependent on the second address boundary of the application and the time budgets for the third and fourth sensings.

Another illustrative embodiment of the present invention is a method of operating a memory device having a Flash memory cell array to provide data to an application in response to a read command, wherein the application has a first address boundary at first times and a second address boundary as second times different than the first times. The method comprises operating the memory device at a preselected first frequency of operation; receiving, during the first frequency of operation operating step, a first read command which includes a first start address; configuring the memory device for the first address boundary of the application; performing a first sequence of sense operations on the Flash memory cell array in response to the first read command; operating the memory device at a preselected second frequency of operation; receiving, during the second frequency of operation operating step, a second read command which includes a second start address; configuring the memory device for the second address boundary of the application; and performing a second sequence of sense operations on the Flash memory cell array in response to the second read command. The first sequence comprises a first sensing of the Flash memory cell array to acquire first data for output, the first sensing having a first position in the first sequence and occurring over a first internal sense time; furnishing the first data as an output of the memory device; a second sensing of the Flash memory cell array to acquire second data for output, the second sensing having a second position in the first sequence and occurring over a second internal sense time; and furnishing the second data as an output of the memory device; wherein the first internal sense time and the second internal sense time are dependent on the first address boundary of the application and the time budgets for the first and second sensings. The second sequence comprises a third sensing of the Flash memory cell array to acquire third data for output, the third sensing having a first position in the second sequence and occurring over a third internal sense time; furnishing the third data as an output of the memory device; a fourth sensing of the Flash memory cell array to acquire fourth data for output, the fourth sensing having a second position in the second sequence and occurring over a fourth internal sense time; and furnishing the fourth data as an output of the memory device; wherein the third internal sense time and the fourth internal sense time are dependent on the second address boundary of the application and the time budgets for the third and fourth sensings.

Another illustrative embodiment of the present invention is method of reading digital memory comprising operating a memory device at a selected operating frequency selected from a plurality of possible operating frequencies for the memory device, the memory device having a Flash memory cell array that is adapted to be sensed in a plurality of sensing operations, and further having a plurality of possible internal sense times for the sensing operations that are based on a plurality of sensing sequences for different address boundary conditions; furnishing a configuration command to the flash memory device for setting a number of read dummy bytes based on the selected operating frequency; furnishing a read command having a start address to the memory device; and receiving data from the memory device with a time budget established by the number of read dummy bytes parameter and by one or more of the possible internal sense times corresponding to one of the sensing sequences for the address boundary condition of the start address.

Another illustrative embodiment of the present invention is a method of reading digital memory in an application, comprising operating a memory device at a selected operating frequency selected from a plurality of possible operating frequencies for the memory device, the memory device having a Flash memory cell array that is sensed in a plurality of sensing operations, and further having a plurality of possible internal sense times for the sensing operations that are based on a plurality of sensing sequences for different address boundary conditions; furnishing a configuration command to the flash memory device having a number of read dummy bytes parameter based on the selected operating frequency; furnishing a configuration command to the flash memory device for setting an address boundary parameter for the application; furnishing a read command having a start address to the memory device; and receiving data from the memory device with a time budget established by the number of read dummy bytes parameter and by one or more of the possible internal sense times corresponding to one of the sensing sequences for the address boundary condition of the address boundary parameter.

Another illustrative embodiment of the present invention is a memory device comprising a Flash memory cell array; a circuit for determining an address boundary from a plurality of different potential address boundaries from a start address in a read command; a circuit coupled to the address boundary determining circuit for establishing a sequence of internal sensing times corresponding to one of a plurality of different sense sequences for the Flash memory cell array respectively based on the different potential address boundaries; a plurality of sense amplifiers coupled to the internal sensing times establishing circuit and to the Flash memory cell array for performing the plurality of sequential sensing operations on the Flash memory cell array in accordance with the plurality of internal sensing times to acquire data from the Flash memory cell array; and command and control logic coupled to the sense amplifiers for furnishing the acquired data from an output of the memory device.

Another illustrative embodiment of the present invention is a memory device comprising a Flash memory cell array; command and control logic for determining an address boundary from a start address in a read command, the command and control logic comprising a multiplexer for selecting internal sense times for sensing the Flash memory cell array in a sequence of sensings, the internal sense times being established for at least two sense sequences in accordance with the address boundary and respective positions of the sensings in the sense sequences; and a plurality of sense amplifiers coupled to the multiplexer and to the Flash memory cell array for sensing the Flash memory cell array to acquire data; and the command and control logic further being coupled to the sense amplifiers for furnishing the acquired data from an output of the memory device.

Another illustrative embodiment of the present invention is a memory device having a Flash memory cell array to provide data to an application in response to a read command, wherein the application has an address boundary, comprising a Flash memory cell array; means for receiving a read command which includes a start address; means for configuring the memory device for the address boundary of the application; means for performing a sequence of sense operations on the Flash memory cell array in response to the read command. The sequence comprises a first sensing of the Flash memory cell array to acquire first data for output, the first sensing having a first position in the sequence and occurring over a first internal sense time; and a second sensing of the Flash memory cell array to acquire second data for output, the second sensing having a second position in the sequence and occurring over a second internal sense time; wherein the first internal sense time and the second internal sense time are dependent on the address boundary of the application and the time budgets for the first and second sensings. The memory device further comprises means for furnishing the first data as an output of the memory device; and means for furnishing the second data as an output of the memory device.

BRIEF DESCRIPTION OF THE SEVERAL VIEWS OF THE DRAWINGS

FIG. 7 is a table showing internal sense timing and suitable numbers of dummy clocks for various address boundary conditions and operating frequencies.

DETAILED DESCRIPTION OF THE INVENTION, INCLUDING THE BEST MODE

Figure 1:
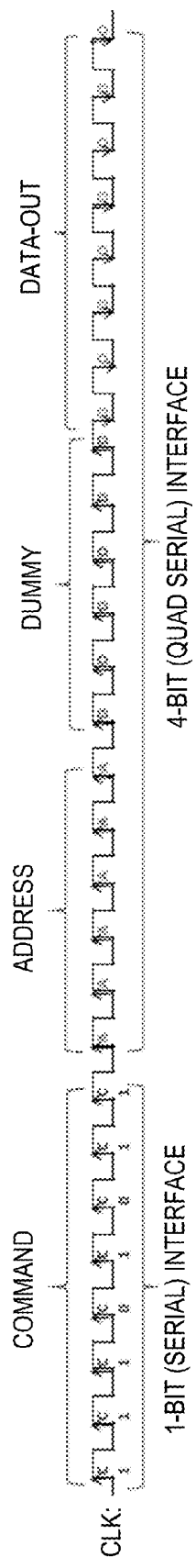
FIG. 1 is a waveform diagram of a command signal.
Figure 2:
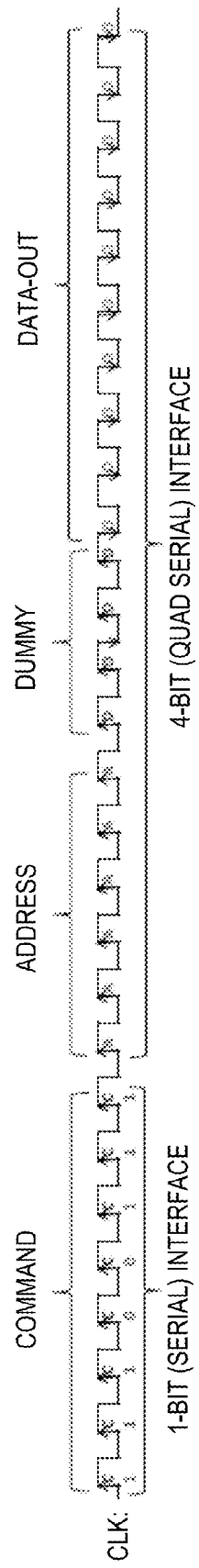
FIG. 2 is a waveform diagram of another command signal.

A Flash memory device operable under a single-bit or multiple-bit serial protocol is configurable for the address boundary or address boundaries of the application, thereby enabling the use of the same address boundary configurable ("ABC") read command regardless of the address boundary or address boundaries of the application. The Flash memory device may be configured for an address boundary of the application automatically from, for example, the least significant bits of the start address of the ABC read command, or from an address boundary parameter that may be specified in a preceding configuration command. Based on the address boundary configuration, the internal sense times of the Flash memory device may be optimized, thereby improving performance of the Flash memory device over memory devices which use a fixed internal sense time for sensing memory. The number of dummy bytes for the read command may be specified or configured in advance by the user, based on the address boundary of the application and the desired frequency of operation of the Flash memory device. In most applications, the Flash memory device is operated at a fixed frequency and the address boundary is fixed as byte, word, or double word, so that the user need specify or configure the number of dummy bytes only once. However, for those applications in which the address boundary changes or the frequency of operation of the Flash memory device changes, the number of dummy bytes may also be changed and therefore may be again specified or configured for the ABC read command in advance by the user. Therefore, Flash memory device read performance is improved both by minimizing the number of dummy bytes for the read command and optimizing the internal sense times, to accommodate a higher frequency of operation of the Flash memory device for the address boundary of the application.

The term "Flash memory device" as used in this patent application means any type of memory device which includes any type of Flash memory cell in any memory architecture such as NOR, NAND, or any combination thereof, either alone or in combination with any other type of memory cells in any other type of memory architecture. A Flash memory device may be in any form, including unpackaged in chip form, packaged as a discrete memory device in any suitable type of package such as Small Outline Integrated Circuit ("SOIC") Package, Very Very Thin Small Outline No Lead ("WSON") Package, Dual Inline Package ("DIP"), or any other of the many package types commercially available, and as a circuit module for integration with other circuit modules in forming a large scale integrated circuit, a wafer-scale integrated circuit, a three-dimensional integrated circuit, or a system-on-a-chip. A Flash memory device may use any suitable interface protocol or combinations of suitable interface protocols, including single-bit serial protocol such as the SPI protocol, multiple-bit serial protocol such as SPI-Dual, SPI-Quad, and QPI, and parallel. The terms "byte boundary" refers to an address boundary without address restriction, "word boundary" refers to an address boundary restricted by A0=0, and "double-word boundary" (d-word) refers to an address boundary restricted by A0=A1=0. The term "address boundary configurable read command" or "ABC read command" means a read command which is not restricted by any particular address boundary condition, so that the Flash memory device may be configured for different address boundaries without changing the read command.

The term "internal sense time" refers to the time required by a Flash memory device to sense a group of Flash bits. Internal sense time may be expressed as a multiple of a clock period $T_{CC}$. In many types of Flash memory devices, a number of Flash bits (for example, 32 bits) are sensed concurrently as a group to achieve better read performance. A Flash memory device may be provided with the ability to dynamically adjust its internal sense times based on the address boundary of the address provided in a ABC read command, as well as the position of the sense in the sense sequence. The internal sense times (i.e. "first internal sense time", "second internal sense time", "third internal sense time", and so forth) for successive groups of Flash bits may be the same or they may differ such that the "first internal sense time" is the time duration to sense a first group of Flash bits, the "second internal sense time" is the time duration to sense the next group of Flash bits, the "third internal sense time" is the time duration to sense the next group of Flash bits, and so forth. The first internal sense time may be different from the subsequent internal sense times (i.e. second internal sense time, third internal sense time, and so forth). The subsequent internal sense times may all have the same time duration, or may all have different time durations, or may have in part the same time duration and in part different time durations. The address boundary may be determined by reading the lower significant bits ("LSB") of the address (e.g. A0, A1) in real time to adaptively optimize the internal sense time.

Figures 3, 4:
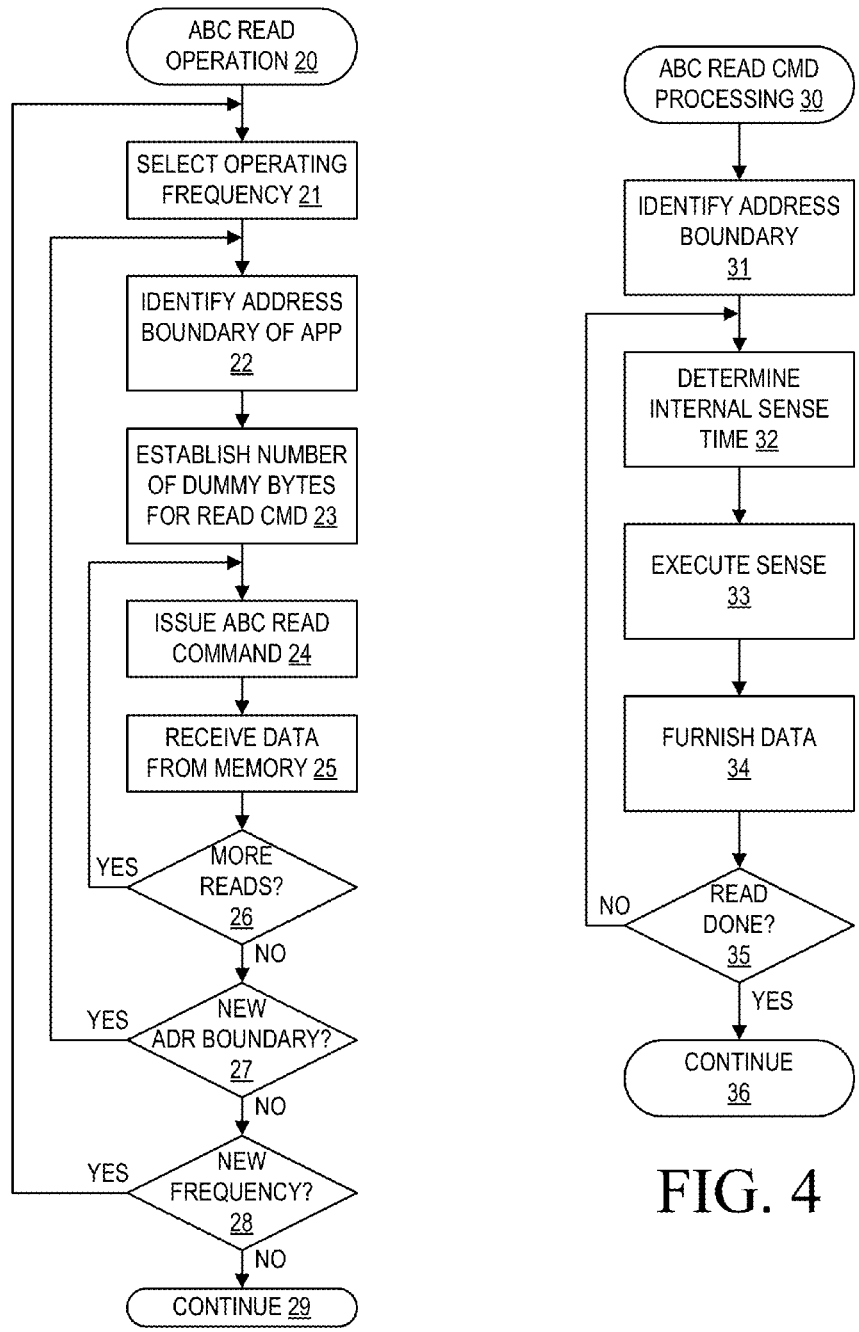
FIG. 3 is a flowchart of an address boundary configurable read operation.
FIG. 4 is a flowchart showing processing of an address boundary configurable read command by a Flash memory device.

FIG. 3 is an example of how a Flash memory device which has configurable internal sense time may be operated to carry out an ABC read operation 20, and FIG. 4 is an example of how such a Flash memory device may process a ABC read command 30. In implementing a particular application, the user may select the operating frequency for the Flash memory device from the range of frequencies supported by the Flash memory device (block 21), and may also identify the type of address boundary used by the application (block 22). Based on the operating frequency and address boundary type, the user may establish the minimum number of dummy bytes required for the ABC read command (block 23). An illustrative technique for establishing the number of dummy bytes is the use of a configuration command issued to the Flash memory device in advance of the ABC read command. The ABC read command may then be issued (block 24), whereupon it may be processed in the Flash memory device in accordance with the process shown in FIG. 4. The data requested in the ABC command is received (block 25), and reading may continue as desired (block 26—YES). Should the application require a different address boundary, the new address boundary may be specified (block 27 YES, block 22). Should the user wish to operate the Flash memory device at a different frequency, the frequency may be specified (block 28 YES, block 21). When the read operations are concluded (block 26—NO, block 27—NO, and block 28—NO), processing may continue with other operations (block 29).

With reference to FIG. 4, when the ABC read command is received by the Flash memory device, the Flash memory device inspects the address field of the ABC read command to identify the type of address boundary (block 31), from which it may determine the internal sense time (block 32) optimal for the address boundary. Alternatively, the address boundary may be specified to the Flash memory device in a configuration command (not shown) issued in advance of the ABC read command, from which it may determine the optimal internal sense time (block 32). The block of Flash bits is then sensed (block 33) and the data is furnished (block 34). Although FIG. 4 shows the data being furnished after one sense and before the next, it will be appreciated that the data may be furnished during the next sense. Subsequent sensing operations occur (block 35—NO, block 32, block 33, block 34) until the read is finished (block 35—YES). Although the address boundary is established by the address in the ABC read command (block 31) and is maintained for the entire read operation, the internal sense time may be varied depending on the position of the sense in the sense sequence. The internal sense time may be the same throughout the entire read operation or throughout a portion of the read operation, in which case the act of determining the internal sense time (block 32) is not performed again. Processing may continue with other operations (block 36).

Figure 5:
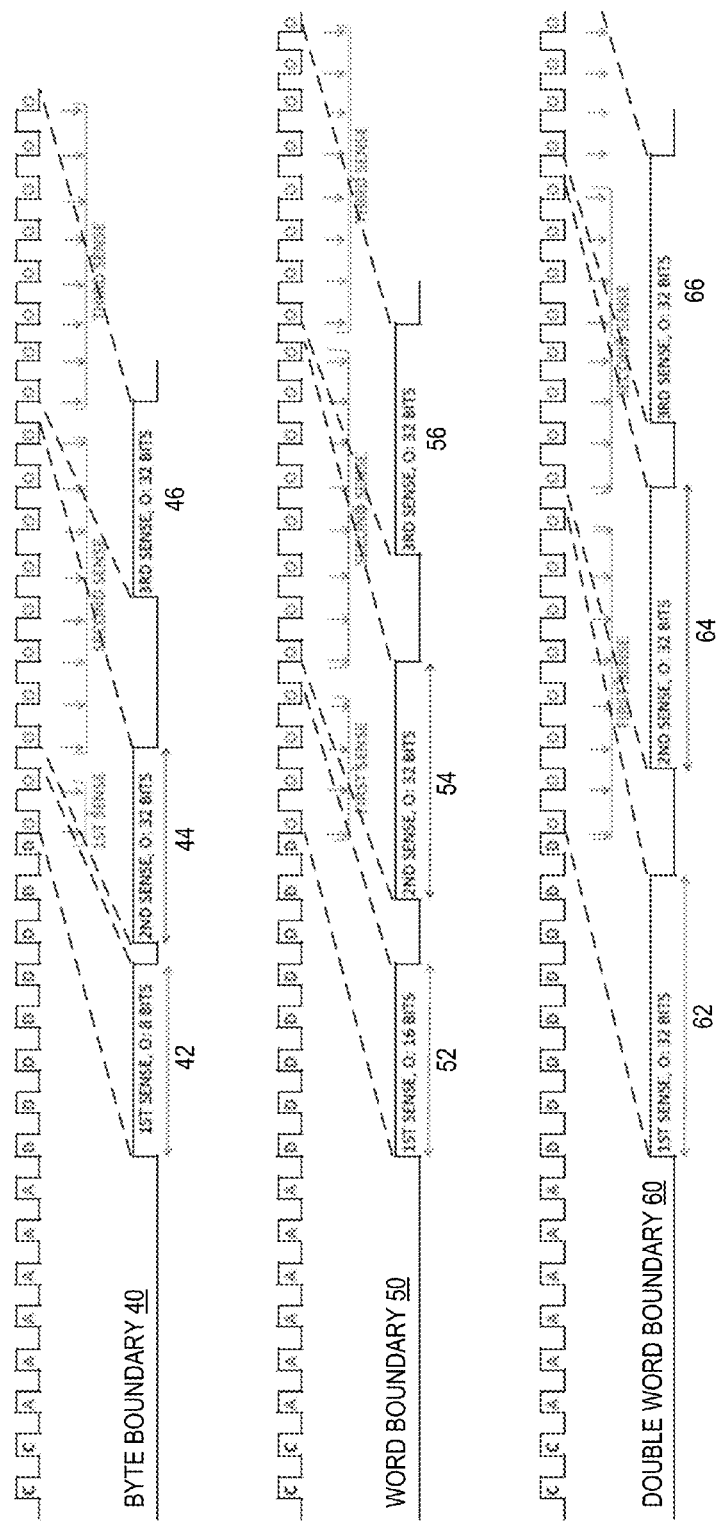
FIG. 5 is a waveform diagram of a command with various address boundaries, and the internal sense timing associated therewith.

FIG. 5 shows an example of an illustrative ABC read command EBh_QPI which invokes "internal sense time" configuration based upon the address boundary and the sense sequence. The internal sense time may be configured either from a configuration command or from the address boundary (e.g. byte, word, double word) of the start address, which may be identified by the LSB's of the start address in the ABC read command. The read command EBh_QPI may invoke different internal sense times for improving read performance. One suitable manner of determining the internal sense times based upon the LSB's of the start address is calculation using a suitable logic circuit, wherein the calculation is based upon the LSB's of the address and the sense sequence. Another suitable manner of determining the internal sense times is a look-up table with multiple stored values (i.e. multiple stored sense times), wherein the appropriate value (i.e. the appropriate sense time) is selected from the look-up table based upon the LSB's of the address and the sense sequence. Yet another suitable manner of determining the internal sense times is selection by a multiplexer or MUX from a choice of predetermined and internally available internal sense times which may be based on the LSB's of the address and the sense sequence.

While the first and subsequent internal sense times may be the same, practical considerations may call for the subsequent sense times to be greater than the first sense time. This is because as a practical matter, a Flash memory device encounters more noise during subsequent sensing operations due to output switching. In contrast, the Flash memory device does not encounter such noise during first sensing since the outputs are not switching. Because of this noise consideration and other design considerations during subsequent sensing, the subsequent sensing times may advantageously be made greater than the first sensing time; see also FIG. 7.

Various time budgets are evident in FIG. 5. The time budget may be considered to be the amount of time available for the first sense, the second sense, and the gap between them. The end of the first and second sensings occurs at about 2/4/8 clock cycles after 8-dummy clocks have been issued for address boundaries 40/50/60 respectively. This is because data from second sense group of Flash cells (32 bits) starts to output at 2/4/8 clock cycles after 8-dummy clocks have been issued respectively. Due to this consideration, the budget for "combined first and second sense times" (as shown in FIG. 5) is $9.5T_{CC}/11.5T_{CC}/15.5T_{CC}$ respectively, where $T_{CC}$ is clock period. This budget also includes gap (dead times) between first sense time and second sense times. Generally, the time budget may be seen to be "number of dummy clocks" plus "number of clocks required to output the first sense data" less one-half clock. Illustratively for the two dummy case, the budget would be 3.5 $T_{CC}$/5.5 $T_{CC}$/9.5 $T_{CC}$ for a byte/word/double-word boundary respectively. Illustratively for the four dummy case, the budget would be 5.5 $T_{CC}$/7.5 $T_{CC}$/11.5 $T_{CC}$ for a byte/word/double-word boundary respectively. Illustratively for the six dummy case, the budget would be 7.5 $T_{CC}$/9.5 $T_{CC}$/13.5 $T_{CC}$ for a byte/word/double-word boundary respectively. Illustratively for the eight dummy case, the budget would be 9.5 $T_{CC}$/11.5 $T_{CC}$/15.5 $T_{CC}$ for a byte/word/double-word boundary respectively (see FIG. 5). This preceding discussion clarifies different budgets for different address boundaries, with largest budget for double-word boundary and smallest budget for byte boundary. Generally speaking, the larger budget for double-word boundary relative to a word boundary, and for a word boundary relative to a byte boundary, enables higher frequency operation of the Flash memory device for the same number of dummy bytes, or a smaller number of dummy bytes for the same frequency operation.

The potential for read performance improvement offered by the ABC read command may not be realized in all Flash memory designs or for all combinations of dummy bytes and boundary conditions due to the constraints of various design choices. Moreover, the particular division of "first and second internal sense time" budget into first internal sense time and second internal sense time is based on design choice and other considerations such as noise. As shown in FIG. 5 and FIG. 7, the budget of $9.5T_{CC}/11.5T_{CC}/15.5T_{CC}$ is divided into 4.5 $T_{CC}$/4.5 $T_{CC}$/6.5 $T_{CC}$ for first internal sense time and into 4.5 $T_{CC}$/5.5 $T_{CC}$/6.5 $T_{CC}$ for second internal sense time respectively. The first and second internal sense times do not precisely add up to the budget due to some time (0.5 $T_{CC}$/1.5 $T_{CC}$/2.5 $T_{CC}$) assigned for gap between first and second internal sense times. The gap is assigned between any two consecutive senses (e.g. between first and second sense) to provide time for internal address change, voltage charging and voltage discharging, and so forth. Therefore, the gap allows preparation time prior to the next sense operation.

Figure 6:
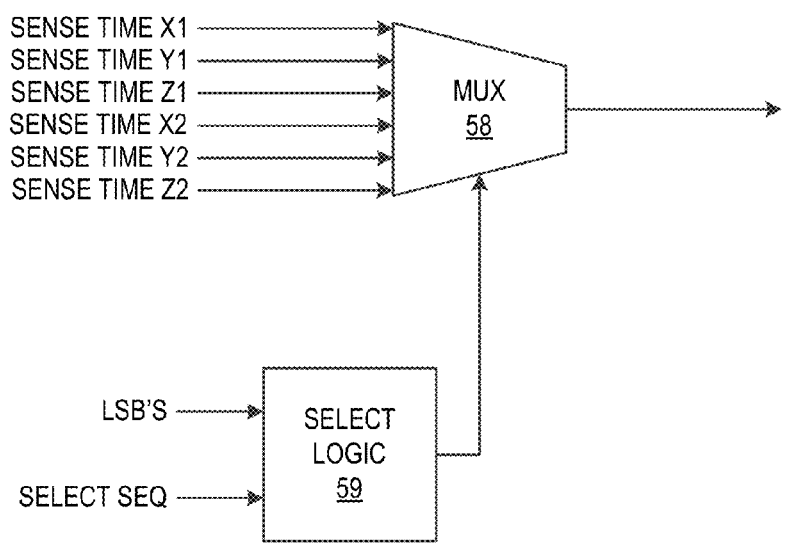
FIG. 6 is a schematic block diagram of an illustrative implementation of a multiplexer circuit for selecting sense time.

FIG. 6 shows an example of how a MUX may be used to determine the appropriate internal sense time. The example of a multiplexer is illustrative, since many other suitable logic circuits may be designed and used to generate or select internal sense times based upon LSB's of address and the sense sequence. Multiplexer or MUX 58 is responsive to select logic 59 to select between six different sense times X1, Y1, Z1, X2, Y2 and Z2. The select logic evaluates the least significant bits of the address along with the position of the sense in the sense sequence, and provides an input select signal to the MUX 58 in accordance therewith to select the appropriate internal sense time. Thus read performance depends on the start address and the sense sequence.

With reference to FIG. 5 and FIG. 6, an illustrative set of sense times may be the following. The first internal sense time may be selected from sense time X1 for a byte boundary, sense time Y1 for a word boundary, and sense time Z1 for a double word boundary. The select logic 59 generates a first select signal for the MUX 58 for selecting the first internal sense time from sense times X1 (byte boundary), Y1 (word boundary), and Z1 (double word boundary), based upon the LSB's of the address as well as the position of the sense in the sense sequence, namely the first sensing operation. The select logic 59 further generates subsequent select signals for the MUX 58 for selecting all subsequent internal sense times from sense times X2 (byte boundary), Y2 (word boundary), and Z2 (double word boundary), based upon the LSB's of the address as well as the sense sequence, namely all sensing subsequent to the first sensing operation.

The illustrative signal waveforms and their illustrative associated internal sense time sequences as shown in FIG. 5 are for the QPI interface. In the QPI interface, all of the interface (e.g. 8-bit command, address, optional dummy bytes, and data) is done on a 4-bit basis. As such QPI interface can provide 8-bit command in two clock cycles, as shown in FIG. 5. Upon receiving the ABC read command, address, and dummy bytes, the Flash memory device starts sending data-out to the user. Illustrative, the command and address are latched on the rising edge of clock, whereas data-out is sent by the Flash memory device on the falling edge of clock.

The signal waveforms and their associated sequence of internal sense times are illustratively for a byte boundary condition 40, a word boundary condition 50, and a double word boundary condition 60, respectively. The signal waveforms illustratively contain eight dummy clocks. The first byte of data 42 from the sense sequence for the byte boundary condition 40 is output in just two clocks, thereby reducing the budget of time available for the first and second internal sense times. The reduced budget places a limitation on the maximum clock frequency for the Flash memory device. The first two bytes of data 52 from the sense sequence for the word boundary condition 50 are output in four clocks, thereby reducing the budget of time available for the first and second internal sense times, but not by as much as for the sense sequence for the byte boundary condition 40. The first four bytes of data 62 from the sense sequence for the double-word boundary condition 60 are output in eight clocks, which provides a large budget of time for the first and second internal sense times. While the sensing operation is internally done concurrently for the same size group of Flash bits (e.g. 4 bytes) irrespective of the address boundary, only the last one byte, the last two bytes, and all four bytes are sent out as output by the Flash memory device for the byte/word/double-word address boundary case respectively during the first sensing operation. For all of the address boundaries 40, 50 and 60, data is subsequently sensed and output in successive 32 bit (4 byte) groups in eight clocks for each group. However, as may be appreciated from the generally progressive increase in internal sense time from byte boundary to word boundary to double word boundary, the double word boundary has the best read performance, followed by word boundary, and then by byte boundary with the lowest read performance. This adaptive internal sense time based on the user application (e.g. address boundary) thus provides different and optimum read performance.

The number of dummy bytes may be configured for the Flash memory device by the user issuing an appropriate command. While dummy bytes may be "don't care" bytes (e.g. Data-in 1 or 0 has no effect), the term "dummy bytes" as used herein may include auxiliary byte(s) such as mode bytes. All else being equal, system read performance may be improved by reducing the number of dummy bytes. Any suitable command may be used to set the number of dummy bytes, and the command may be specific for setting the number of dummy bytes, or may include configuring the address boundary, and setting additional read parameters such as the number of bytes of wrap length for instructions such as burst read with wrap. The number of dummy bytes, along with the value of the LSB's of address and the sense sequence, also vary the budget for the first internal sense time and the subsequent internal sense time. The number of dummy bytes may be configured just once before all read operations in the application, or may be configured any number of times during the application if appropriate for the application.

FIG. 7 is a table showing an example of maximum operating frequencies for various address boundaries, sense sequence number, and number of dummy clocks. Illustratively, the number of dummy bytes may have a default value upon power up, such as, for example, 2 dummy bytes, but may be manually configurable at any time, either once before any read command is issued, or from time to time during an application, to 4, 6, 8 or other number of dummy bytes by issuing an appropriate command. The configurations shown in the table of FIG. 7 are only examples to facilitate understanding, and many different variants may be used to achieve a similar degree of optimization. Assume for the purposes of explanation that the minimum time requirement for sensing in a particular Flash memory device of interest is 35 ns. For this 35 ns requirement, the sense times shown in the table as multiple of the clock period Tcc may be converted into a maximum operating frequency. For simplicity, further assume that the maximum operating frequency is the lower of the frequency between first sensing operation and the subsequent sensing operations (indicated in the table of FIG. 7 by a double asterisk). For practical purposes, a guard band of more than 10 MHz may be added due to noise and other considerations. As indicated by the table of FIG. 7, two dummy clocks are suitable in applications up to about 30 MHz (Tcc=33 ns) irrespective of address boundary. Four dummy clocks are suitable for byte address boundary applications up to about 50 MHz (Tcc=20 ns), and for word and double-word address boundary applications up to about 80 MHz (Tcc=12 ns). Six dummy clocks are suitable for byte address boundary applications up to about 80 MHz (Tcc=12 ns), and for word address and double-word address boundary applications up to about 104 MHz (Tcc=10 ns). Eight dummy clocks are suitable for byte and word address boundary applications up to about 104 MHz (Tcc=10 ns), and for double-word address boundary applications up to about 166 MHz (Tcc=6 ns), when such operating frequencies become available.

It will be appreciated that the maximum operating frequencies as discussed herein pertain to the various dummy clock cases, and do not take into account other constraints due to logic block design. Although other constraints presently limit the maximum operating frequency of many Flash memory devices to about 104 MHz, thereby rendering the 166 MHz clock speed presently unattainable and the eight-dummy case of lesser practical value at present, the maximum operating frequency can be expected to continue to increase so that the eight-dummy case is expected to be of practical value in the future. At present, the four-dummy and six-dummy cases are of greatest practical utility.

An example of improved read performance is the following. In a design not optimized for address boundary, the speed performance may be byte-based (i.e. the slowest) irrespective of the fact that address boundary in an application may be word or double word, and six-dummy bytes may be used. However, if the design is adaptively optimized for a double-word boundary application, the four-dummy case with adaptive read may be used to provide superior read performance. Therefore, in a design adaptively optimized for address boundary, the same read command may be used with six dummy bytes to read a Flash memory device clocked at 80 MHz in an application with a byte address boundary, as may be used with four dummy bytes to read a Flash memory device clocked at 80 MHz in another application with a double-word address boundary. This provides great flexibility with only one type of read command, namely the ABC read command. For example, there would be no need to have another read command for 8-dummy case when 8-dummy case applications become practical.

Another example of improved read performance is the following. With reference to the eight-dummy case, the internal sense time of 6.5xTcc for double word boundary applications (in a design optimized for address boundary in accordance with the teachings herein) is about 40% larger than the internal sense time of 4.5XTcc as might be used without the benefit of address optimization. In a design that is not address-optimized, the internal sense time is commonly byte-based irrespective of the address boundary being a word or double-word boundary.

Another example of improved read performance is the following. For a read command without address restriction, the maximum read frequency for a W25Q64DW Flash memory device was 30 MHz with 2 dummy clocks, 50 MHz with 4 dummy clocks, 80 MHz with 6 dummy clocks, and 104 MHz with 8 dummy clocks. However, for a read command with double-word boundary restriction, the maximum read frequency for the W25Q64DW device was 30 MHz with 2 dummy clocks, 80 MHz with 4 dummy clocks, 104 MHz with 6 dummy clocks, and 104 MHz with 8 dummy clocks. Improvement in read performance is evident for the four-dummy and six-dummy cases in applications with a double-word address boundary restriction.

Figure 8:
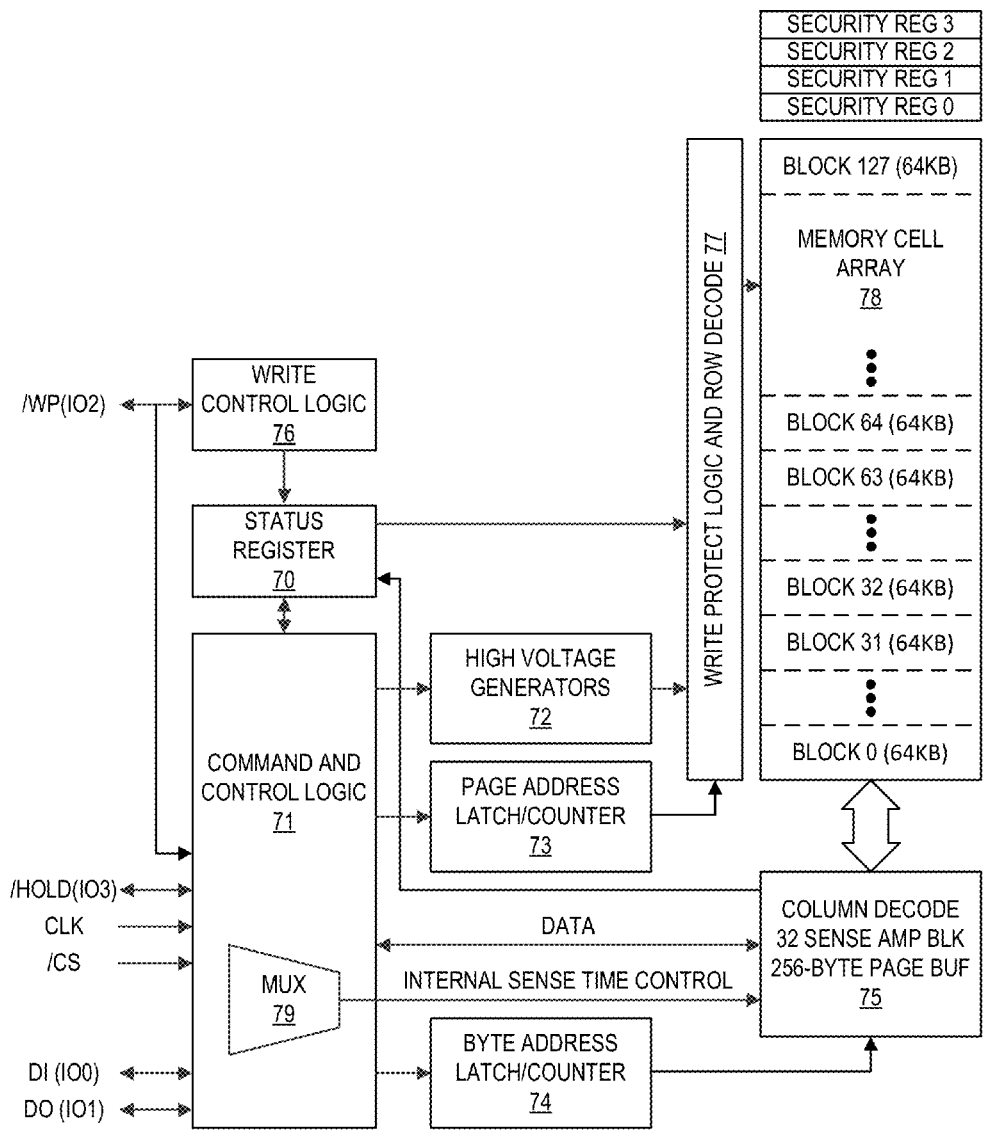
FIG. 8 is a schematic circuit diagram of a Flash memory device architecture.

FIG. 8 is a block diagram showing an illustrative Flash memory device architecture which is suitable for executing the ABC read command, and which is further described in a publication by Winbond Electronics, W25Q64DW spiflash 1.8V 64M-Bit Serial Flash Memory with Dual/Quad SPI & QPI, Preliminary Revision C, Jan. 13, 2011, which hereby is incorporated herein in its entirety by reference thereto. Many other types of Flash memory devices may be modified in accordance with the teachings herein to execute a ABC read command. A flash memory cell array 78 is addressed by row decode circuit 77 and column decode circuit 75, the later containing a 256 byte page buffer for writing to the Flash memory cell array 78 and a thirty-two sense amplifier block for reading from the Flash memory cell array 78. Write protect logic 77 is responsive to the status register 70 to prevent writing to the Flash memory cell array 78 under certain circumstances. Command and control logic 71 controls the high voltage generators 72 and page address latch and counter 73, which in turn control the row decode circuit 77. The command and control logic 71 also controls the byte address latch and counter 74, which in turn controls the column decode circuit 75. The command and control logic 71 includes four I/O pins IO0-IO3, a serial clock input pin CLK, and a chip select input pin /CS.

Illustratively, a multiplexer or MUX 79 is included in the command and control logic 71 for providing an internal sense time control signal to the thirty-two sense amplifier block 75. The select logic is implemented in the command and control logic 71. All thirty-two sense amplifiers may be used irrespective of the address boundary.

The Flash memory device of FIG. 8 supports SPI and QPI operations, including standard SPI instructions, dual SPI instructions, quad SPI instructions, and QPI instructions. QPI operations are supported when the device is switched from Standard/Dual/Quad SPI mode to QPI mode using the "Enable QPI (38h)" instruction. The device may be switched back into Standard/Dual/Quad SPI mode using the "Disable QPI (FFh)" instruction.

Although the W25Q64DW device uses ABC read instructions only in QPI mode, ABC read instructions may be used in modes other than QPI such as the various SPI modes. Illustrative ABC read instructions may include a Fast Read Quad I/O (EBh_QPI) QPI mode instruction, a Fast Read (0Bh_QPI) QPI mode instruction, and a Burst Read with Wrap (0Ch_QPI) instruction. The number of dummy clocks may be configured as either 2, 4, 6 or 8 by a "Set Read Parameters (C0h)" instruction. Similar ABC instructions may be supported for SPI Quad mode.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. Moreover, specific values given herein are illustrative, and may be varied as desired. A reference to various values of a range is inclusive of all values within the range. These and other variations and modifications of the embodiments disclosed herein, including of the alternatives and equivalents of the various elements of the embodiments, may be made without departing from the scope of the invention.

The invention claimed is:

1. A method of operating a memory device having a Flash memory cell array to provide data to an application in response to a read command, wherein the application has an address boundary, comprising:
   receiving a read command which includes a start address;
   configuring the memory device for the address boundary of the application; and
   performing a sequence of sense operations on the Flash memory cell array in response to the read command, the sequence comprising:
   a first sensing of the Flash memory cell array to acquire first data for output, the first sensing having a first position in the sequence and occurring over a first internal sense time;
   furnishing the first data as an output of the memory device;
   a second sensing of the Flash memory cell array to acquire second data for output, the second sensing having a second position in the sequence and occurring over a second internal sense time; and
   furnishing the second data as an output of the memory device;
   wherein the first internal sense time and the second internal sense time are variable for improved read performance depending on the address boundary of the application and a time budget for the first and second sensings.

2. The method of claim 1 wherein the first internal sense time and the second internal sense time are variable depending on the respective positions of the first and second sensings in the sequence.

3. The method of claim 1 wherein the sequence further comprises:
performing a third sensing of the Flash memory cell array to acquire third data for output, the third sensing having a third position in the sequence and occurring over a third internal sense time; and
furnishing the third data as an output of the memory device.

4. The method of claim 3 wherein the first internal sense time is less than the second and third internal sense times.

5. The method of claim 4 wherein the second and third internal sense times are equal.

6. The method of claim 4 wherein the second and third internal sense times are unequal.

7. The method of claim 3 wherein the first, second and third internal sense times are equal.

8. The method of claim 1 wherein the configuring step comprises configuring the memory device for the address boundary of the application based on one or more least significant bits of the start address.

9. The method of claim 1 further comprising:
receiving a configuration command prior to the step of receiving the read command, the configuration command including an address boundary parameter;
wherein the configuring step comprises configuring the memory device for the address boundary of the application in accordance with the address boundary parameter.

10. The method of claim 1 further comprising:
receiving a configuration command prior to the step of receiving the read command, the configuration command including a number of dummy clocks parameter; and
configuring the memory device for insertion of dummy clocks upon receipt of the read command in accordance with the number of dummy clocks parameter.

11. A method of operating a memory device having a Flash memory cell array to provide data to an application in response to a read command, wherein the application has a first address boundary at first times and a second address boundary at second times different than the first times, comprising:
receiving a first read command which includes a first start address;
configuring the memory device for the first address boundary of the application;
performing a first sequence of sense operations on the Flash memory cell array in response to the first read command, the first sequence comprising:
a first sensing of the Flash memory cell array to acquire first data for output, the first sensing having a first position in the first sequence and occurring over a first internal sense time;
furnishing the first data as an output of the memory device;
a second sensing of the Flash memory cell array to acquire second data for output, the second sensing having a second position in the first sequence and occurring over a second internal sense time; and
furnishing the second data as an output of the memory device;
wherein the first internal sense time and the second internal sense time are dependent on the first address boundary of the application and a time budget for the first and second sensings;
receiving a second read command which includes a second start address;
configuring the memory device for the second address boundary of the application; and
performing a second sequence of sense operations on the Flash memory cell array in response to the second read command, the second sequence comprising:
a third sensing of the Flash memory cell array to acquire third data for output, the third sensing having a first position in the second sequence and occurring over a third internal sense time;
furnishing the third data as an output of the memory device;
a fourth sensing of the Flash memory cell array to acquire fourth data for output, the fourth sensing having a second position in the second sequence and occurring over a fourth internal sense time; and
furnishing the fourth data as an output of the memory device;
wherein the third internal sense time and the fourth internal sense time are dependent on the second address boundary of the application and a time budget for the third and fourth sensings.

12. The method of claim 11 wherein:
the step of configuring the memory device for the first address boundary of the application comprises configuring the memory device for the first address boundary of the application based on one or more least significant bits of the first start address; and
the step of configuring the memory device for the second address boundary of the application comprises configuring the memory device for the second address boundary of the application based on one or more least significant bits of the second start address.

13. The method of claim 11 further comprising:
receiving a first configuration command prior to the step of receiving the first read command, the first configuration command including a first address boundary parameter;
wherein the step of configuring the memory device for the first address boundary of the application comprises configuring the memory device for the first address boundary of the application in accordance with the first address boundary parameter; and
receiving a second configuration command prior to the step of receiving the second read command, the second configuration command including a second address boundary parameter;
wherein the step of configuring the memory device for the second address boundary of the application comprises configuring the memory device for the second address boundary of the application in accordance with the second address boundary parameter.

14. The method of claim 11 further comprising:
receiving a first configuration command prior to the step of receiving the first read command, the first configuration command including a number of dummy clocks parameter;
configuring the memory device for insertion of dummy clocks into the first read command in accordance with the number of dummy clocks parameter;
receiving a second configuration command prior to the step of receiving the second read command, the second configuration command including a number of dummy clocks parameter; and
configuring the memory device for insertion of dummy clocks into the second read command in accordance with the number of dummy clocks parameter.

15. A method of operating a memory device having a Flash memory cell array to provide data to an application in response to a read command, wherein the application has a first address boundary at first times and a second address boundary at second times different than the first times, comprising:
- operating the memory device at a preselected first frequency of operation;
- receiving, during the first frequency of operation operating step, a first read command which includes a first start address;
- configuring the memory device for the first address boundary of the application;
- performing a first sequence of sense operations on the Flash memory cell array in response to the first read command, the first sequence comprising:
  - a first sensing of the Flash memory cell array to acquire first data for output, the first sensing having a first position in the first sequence and occurring over a first internal sense time;
  - furnishing the first data as an output of the memory device;
  - a second sensing of the Flash memory cell array to acquire second data for output, the second sensing having a second position in the first sequence and occurring over a second internal sense time; and
  - furnishing the second data as an output of the memory device;
  - wherein the first internal sense time and the second internal sense time are dependent on the first address boundary of the application and a time budget for the first and second sensings;
- operating the memory device at a preselected second frequency of operation;
- receiving, during the second frequency of operation operating step, a second read command which includes a second start address;
- configuring the memory device for the second address boundary of the application; and
- performing a second sequence of sense operations on the Flash memory cell array in response to the second read command, the second sequence comprising:
  - a third sensing of the Flash memory cell array to acquire third data for output, the third sensing having a first position in the second sequence and occurring over a third internal sense time;
  - furnishing the third data as an output of the memory device;
  - a fourth sensing of the Flash memory cell array to acquire fourth data for output, the fourth sensing having a second position in the second sequence and occurring over a fourth internal sense time; and
  - furnishing the fourth data as an output of the memory device;
  - wherein the third internal sense time and the fourth internal sense time are dependent on the second address boundary of the application and a time budget for the third and fourth sensings.

16. A memory device having a Flash memory cell array to provide data to an application in response to a read command, wherein the application has an address boundary, comprising:
- a Flash memory cell array;
- means for receiving a read command which includes a start address;
- means for configuring the memory device for the address boundary of the application;
- means for performing a sequence of sense operations on the Flash memory cell array in response to the read command, the sequence comprising:
  - a first sensing of the Flash memory cell array to acquire first data for output, the first sensing having a first position in the sequence and occurring over a first internal sense time; and
  - a second sensing of the Flash memory cell array to acquire second data for output, the second sensing having a second position in the sequence and occurring over a second internal sense time;
  - wherein the first internal sense time and the second internal sense time are dependent on the address boundary of the application and a time budget for the first and second sensings;
- means for furnishing the first data as an output of the memory device; and
- means for furnishing the second data as an output of the memory device.

* * * * *